United States Patent
Ko et al.

(10) Patent No.: US 7,160,671 B2
(45) Date of Patent: Jan. 9, 2007

(54) METHOD FOR ARGON PLASMA INDUCED ULTRAVIOLET LIGHT CURING STEP FOR INCREASING SILICON-CONTAINING PHOTORESIST SELECTIVITY

(75) Inventors: Francis Ko, Taichung (TW); Richard Chen, San-Shar (TW); Charlie Lee, Hsin-Chu (TW)

(73) Assignee: Lam Research Corporation, Fremont, CA (US)

( * ) Notice: Subject to any disclaimer, the term of this patent is extended or adjusted under 35 U.S.C. 154(b) by 734 days.

(21) Appl. No.: 09/894,230

(22) Filed: Jun. 27, 2001

(65) Prior Publication Data

US 2003/0003407 A1     Jan. 2, 2003

(51) Int. Cl.
    *G03F 7/40*     (2006.01)
    *G03F 7/36*     (2006.01)
    *G03F 7/20*     (2006.01)

(52) U.S. Cl. ........................... 430/313; 430/328
(58) Field of Classification Search ................ 430/313, 430/317, 328
See application file for complete search history.

(56) References Cited

U.S. PATENT DOCUMENTS

| | | | | |
|---|---|---|---|---|
| 4,980,563 A | * | 12/1990 | George et al. | 250/492.2 |
| 5,123,998 A | * | 6/1992 | Kishimura | 216/48 |
| 5,899,748 A | * | 5/1999 | Tsai et al. | 438/707 |
| 6,255,022 B1 | * | 7/2001 | Young et al. | 430/5 |
| 6,337,163 B1 | * | 1/2002 | Sato | 430/30 |
| 6,379,869 B1 | * | 4/2002 | Schroeder et al. | 430/313 |
| 6,451,512 B1 | * | 9/2002 | Rangarajan et al. | 430/313 |
| 6,479,820 B1 | * | 11/2002 | Singh et al. | 250/310 |
| 2003/0003683 A1 | * | 1/2003 | Ko et al. | 438/445 |

OTHER PUBLICATIONS

Grant & Hackh's Chemical Dictionary, 5th Edition published by McGraw-Hill in 1987, p. 7.*

* cited by examiner

*Primary Examiner*—S. Rosasco
*Assistant Examiner*—John Ruggles
(74) *Attorney, Agent, or Firm*—Martine, Penilla & Gencarella, LLP

(57) ABSTRACT

A method for increasing etching selectivity of a developed silicon-containing photoresist layer on a non-silicon containing photoresist layer on a substrate. The developed silicon-containing photoresist layer includes polymer chains containing silicon. Next, the developed silicon-containing photoresist layer and uncovered portions of the non-silicon containing photoresist layer are exposed to an ultraviolet (UV) light, where the UV light emanates from a UV generating agent, such as neon, xenon, helium, hydrogen, or krypton gas in an inert gas (e.g., argon, etc.) plasma. A top portion of the developed silicon-containing photoresist layer is then converted to a hardened layer, where the hardened layer is created by cross-linking the polymer chains containing silicon and the cross-linking is activated by the UV light. Next, an etch is performed on the uncovered portions of the non-silicon containing photoresist layer and the substrate using the hardened layer.

12 Claims, 5 Drawing Sheets

METHOD FOR ARGON PLASMA INDUCED ULTRAVIOLET LIGHT CURING STEP FOR INCREASING SILICON-CONTAINING PHOTORESIST SELECTIVITY

CROSS REFERENCE TO RELATED APPLICATIONS

This application is related to U.S. Pat. No. 6,541,361, filed on the same day as the instant application and entitled "PLASMA ENHANCED METHOD FOR INCREASING SILICON-CONTAINING PHOTORESIST SELECTIVITY." This application is hereby incorporated by reference.

BACKGROUND OF THE INVENTION

1. Field of the Invention

This invention relates generally to lithography and more particularly to a method and apparatus for increasing the selectivity of a silicon-containing photoresist layer to improve profile control of etched features without decreasing wafer throughput.

2. Description of the Related Art

The ability to work selectively on small well defined areas of a substrate is paramount in the manufacture of semiconductor devices. In the continuing quest to achieve higher levels of performance and higher functional density of the semiconductor devices, the microelectronics industry is committed to applying new processes to further reduce the minimum feature sizes of the semiconductor devices.

As the feature sizes are reduced, the devices can become smaller or remain the same size but become more densely packed. As such, advances in lithographic technologies used to pattern the semiconductor devices must keep pace with the progress to reduce feature sizes, in order to allow for smaller and more dense. For example, one of the main ways to reduce the device critical dimensions (CD) through lithographic technologies has been to continually reduce the wavelength of the radiation used to expose the photoresist.

Sharp lithographic transmission becomes more of a challenge as wafers progress to higher density chips with shrinking geometries. Furthermore, as metallization transitions to dual damascene processes, lithography techniques to pattern holes or trenches in the dielectric become more critical. In particular, the photoresists employed in the lithographic techniques must provide for proper selectivity so that downstream etching processes yield sharp profiles. Moreover, as device features progressively become smaller, the aspect ratios for those same features become greater, thereby making it more difficult to accurately perform etching operations.

Photoresists are typically polymeric materials consisting of multi-component formulations. Additionally, a photoresist may be applied as a single layer or as multiple layers where one of the layers contains silicon. Multi-layered photoresists tend to offer superior formation of a pattern, therefore, the multi-layered photoresists are desirable as semiconductor devices become smaller. However, resist compositions containing silicon, either in the main resist polymer or by post-exposure surface treatment (e.g., silylation), have either failed to deliver adequate improvement in etch resistance or have had poor processing performance due to the unacceptable selectivity past the silicon containing layer.

As a result, there is a need to solve the problems of the prior art to improve the selectivity past the developed photoresist layer containing silicon, without simultaneously decreasing wafer throughput, so that during etching there is improved ability to distinguish between silicon containing photoresists and non silicon containing photoresists or the dielectric.

SUMMARY OF THE INVENTION

Broadly speaking, the present invention fills these needs by providing a photoresist layer that has been hardened to increase the selectivity of the hardened photoresist layer relative to an underlying photoresist or underlying dielectric. In addition, the hardening process may take place in an etch chamber so that the fabrication, e.g., etching steps, may be combined with treating processes to improve wafer throughput. It should be appreciated that the present invention can be implemented in numerous ways, including as an apparatus, a system, a device, or a method. Several inventive embodiments of the present invention are described below.

In one embodiment, an apparatus for exposing a photoresist-developed substrate is provided. In this embodiment, a chamber is included where the chamber has at least one gas inlet adapted to introduce a gas into the chamber. Also included is a support within the chamber. A substrate on the support where the substrate has at least one developed photoresist layer is included. The substrate is exposed to an ultraviolet (UV) light within the chamber where the UV light is generated from a UV generating agent The exposure of the developed photoresist to the UV light causes at least a portion of the developed photoresist layer to transform to a hardened layer.

In another embodiment of the invention an apparatus for curing a photoresist is provided. In this embodiment, a chamber having at least one gas inlet adapted for introducing an ultraviolet (UV) generating agent into the chamber and a support within the chamber are included. A substrate, on the support, where the substrate has a first photoresist layer and a second photoresist layer is included, where the first photoresist layer is disposed over the second photoresist layer. The first photoresist layer includes silicon containing polymer chains. The silicon containing polymer chains are cross-linked upon exposure to UV light to form a hardened layer at a top region of the first photoresist layer, where the UV light is generated by the UV generating agent.

In yet another embodiment of the invention, a method for increasing a selectivity of a photoresist is provided. The method initiates with providing a substrate with a developed photoresist layer, the developed photoresist layer including polymer chains containing silicon. Next, the substrate is exposed to an ultraviolet (UV) light, where the UV light emanates from a UV generating agent. Finally, a portion of the developed photoresist layer is converted to a hardened layer where the hardened layer is created by cross-linking the polymer chains containing silicon, where the cross-linking is activated by UV light.

In still another embodiment of the invention, a method for curing a photoresist is provided. The method initiates with providing a substrate with a first photoresist layer and a second photoresist layer. The first photoresist layer is developed and disposed over the second photoresist layer and the first photoresist layer is formulated to include polymer chains containing silicon. Next, the first photoresist layer is exposed to ultraviolet (UV) light where the UV light emanates from a UV generating agent. The method terminates after converting a portion of the first photoresist layer to a hardened layer where the hardened layer is configured to increase an etching selectivity ratio.

In still yet another embodiment, a method for curing a photoresist disposed on a wafer in an etch chamber is provided. The method initiates with introducing an ultraviolet (UV) generating agent into an etch chamber through a process gas inlet of the etch chamber. The UV generating agent is induced to emit UV light. Next, the wafer is exposed to the UV light where the wafer has a developed photoresist layer formulated to include polymer chains containing silicon. Then, a portion of the developed photoresist layer is converted to a hardened layer upon exposure to the UV light.

The advantages of the present invention are numerous. Most notably, the formation of the hardened layer increases the selectivity ratio of the underlying photoresist layer or interlayer dielectric relative to the hardened layer of the top photoresist layer. Accordingly, any etch processes performed on the substrate with the hardened layer will etch through the underlying photoresist layer or interlayer dielectric at an increased rate relative to the etch rate of the hardened layer. Furthermore, the etch profile control will be improved as a result of the increased selectivity, thereby allowing for pinpoint accuracy as semiconductor feature size continues to shrink. Additionally, an etch chamber may be utilized for curing the hardened layer. As a result, after the curing process, the substrate may be etched in the same chamber. Hence, throughput is increased and handling of the substrate is minimized.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for an apparatus and a method for enhancing the selectivity of a silicon containing photoresist thereby improving etch profile control. It will be obvious, however, to one skilled in the art, that the present invention may be practiced without some or all of these specific details. In other instances, well known process operations have not been described in detail in order not to unnecessarily obscure the present invention.

The embodiments of the present invention provide an apparatus and method for an improved selectivity of a silicon-containing photoresist which in turn, allows for amelioration of a subsequent etch profile. In one embodiment, a hardened layer is formed in a silicon-containing photoresist by exposing the developed silicon-containing photoresist to ultraviolet (UV) light. In accordance with one embodiment of the invention, the UV light is generated by striking a plasma containing an inert gas such as neon, as will be described below in more detail. The exposure to the UV light causes the polymer chains of the silicon containing photoresist to cross link, thereby creating a hardened layer.

The hardened layer of the silicon-containing photoresist has an increased selectivity relative to an underlying photoresist layer or an underlying interlayer dielectric (ILD). Accordingly, the increased selectivity allows for tighter control of future etching processes, particularly with respect to dual damascene processing. Just as significant, the formation of the hardened layer can take place in an etch chamber. Correspondingly, the etch chamber is configured to control various process parameters as discussed below. In addition, once the silicon-containing photoresist has been hardened, downstream etching processes may occur in the etch chamber without the need to remove the wafer. Consequently, wafer throughput is increased by combining fabrication steps into a single system.

Figure 1:
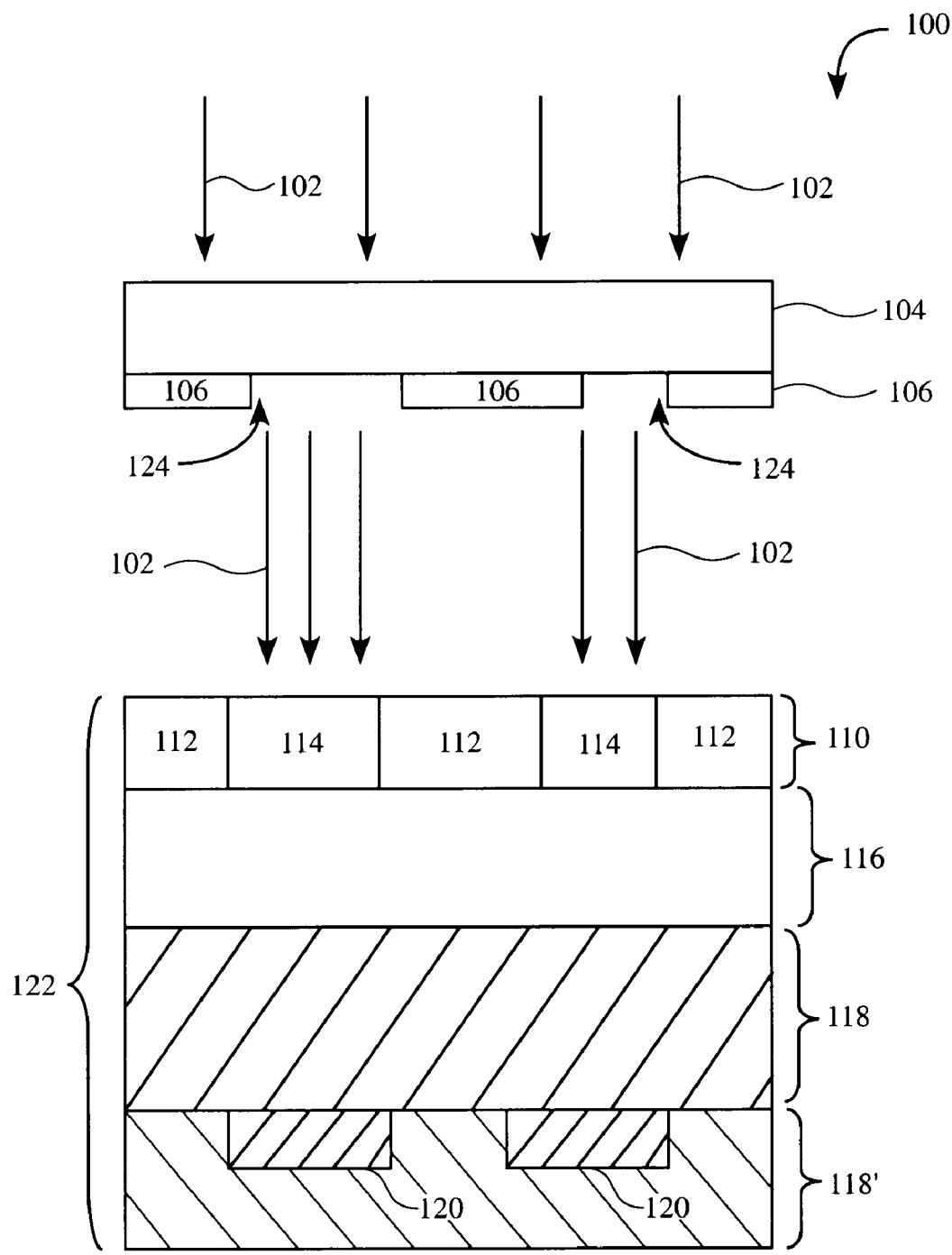
FIG. 1 illustrates a block diagram displaying a substrate in which the top photoresist layer is being exposed prior to development in accordance with one embodiment of the invention.

FIG. 1 illustrates a block diagram 100, displaying a substrate in which the top photoresist layer is being exposed to develop the silicon-containing photoresist in accordance with one embodiment of the invention. In FIG. 1, light 102 from a light source (not shown) passes through a glass reticle 104. The light 102 will not pass through the reticle in the opaque areas 106. The light 102 will not pass through the reticle in the opaque areas 106. In accordance with one embodiment of the invention, the light 102 is ultraviolet (UV) light. It should be appreciated that the source of the UV light here is a mercury arc lamp or excimer laser and is applied as part of the development process. Typically, for a positive resist, the UV light causes a photoacid generator to generate an acid in the exposed regions. Thereafter, during post-exposure bake of the development process the resist is heated causing an acid-catalyzed deprotection reaction. The elevated temperature during post-exposure bake is required for the exposed resist to become soluble in the developer solution. The exposure to UV light prior to development of the photoresist is distinct from the embodiments of the present invention which occur post-exposure.

Continuing with FIG. 1, the light 102 passes through the unblocked areas 124 of the reticle 104 to the substrate 122. The substrate 122 contains a top layer 110 of silicon-containing photoresist over a second layer 116 of non silicon-containing photoresist. An example of the silicon-containing photoresist is Fuji film TIS-200-IL-7 and an example of the non silicon-photoresist is Fuji film TIS-200-IL-5, both of which may be purchased from Arch Chemicals, Inc. of Norwalk Conn. As depicted in FIG. 1, the second layer of non silicon-containing oxide resides over an interlayer dielectric (ILD) 118. In accordance with one embodiment of the invention the ILD 118 is silicon dioxide. In a dual-damascene structure, metal lines 120 are formed in another ILD 118'. The metal lines 120 are copper in accordance with one embodiment of the invention. Although, the underlying features can be any features, so long as access is made to them by etching. The etching performance, however, is significantly improved due to the robust selectivity provided by the post developed UV exposure, which is disclosed below.

Figure 2:
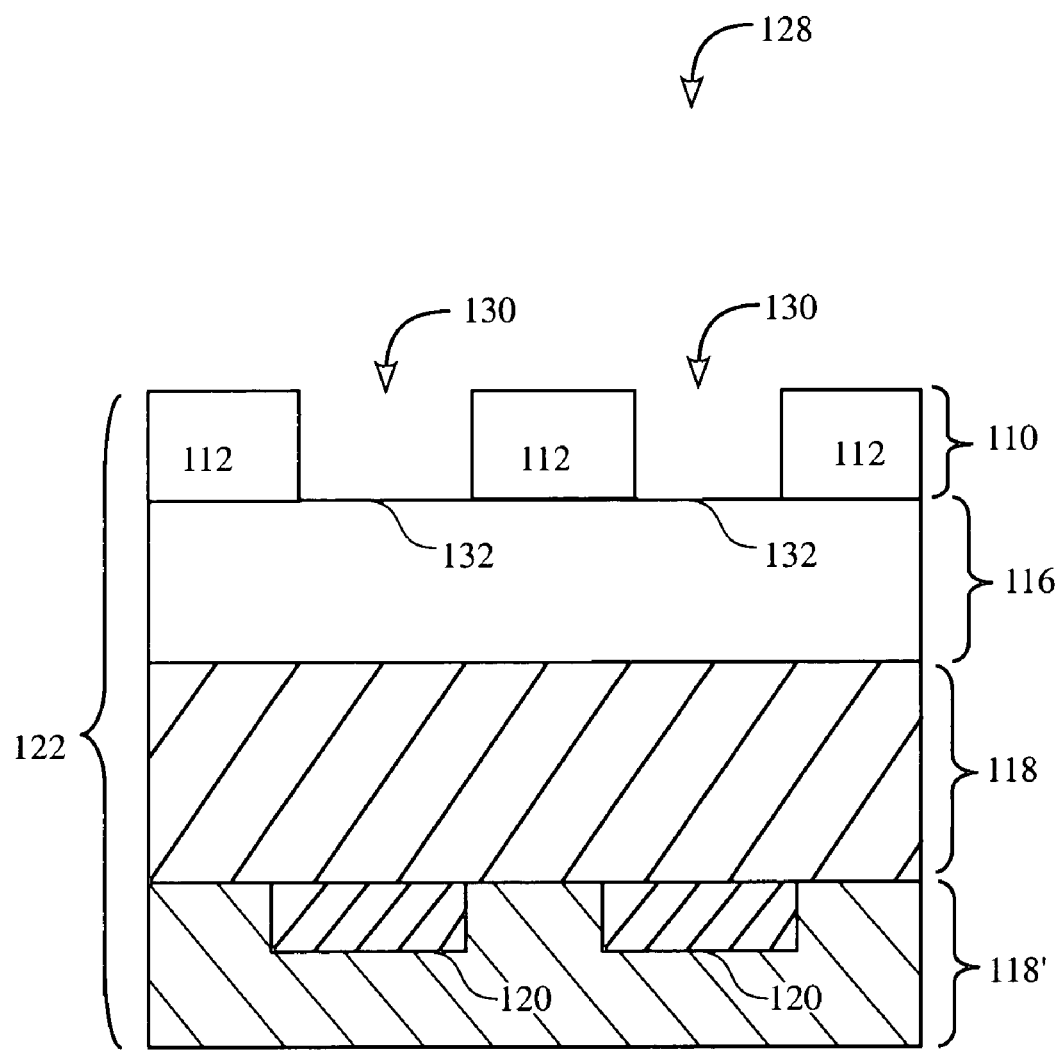
FIG. 2 illustrates a block diagram depicting a developed substrate.

FIG. 2 illustrates block diagram 128 depicting a developed substrate 122. The top layer 110 of silicon-containing photoresist has been developed to remove the silicon-containing photoresist from regions 130, which were exposed to light 102 of FIG. 1. Regions 112 of the silicon-containing photoresist remain on the top layer of substrate 122. The bottom layer 116 of non silicon-containing photoresist remains intact. As can be seen in FIG. 2, the development process removed the silicon-containing photoresist to the border 132 between the top layer 110 of photoresist and the bottom layer 116 of photoresist. In accordance with one embodiment of the invention, the development method may be continuous spray development, puddle development, etc. It should be appreciated that the photoresist 114 exposed to UV light in FIG. 1, becomes more soluble as mentioned above, so that during development the exposed photoresist 114 is removed, as depicted in FIG. 2.

While the above exposure and development of the photoresist has been described for a positive resist, it is understood that the apparatus and method is equally applicable for a negative resist. For example, with a negative resist, the reticle or mask 104 would be modified so as to expose regions 112 and not expose regions 114 of the silicon-containing photoresist layer 110. For this embodiment, the exposed regions 112 become less soluble than unexposed region 114. The negative resist is then developed by a solvent wash of the photoresist layer 110 to remove regions 114 in accordance with one embodiment of the invention.

Figure 3:
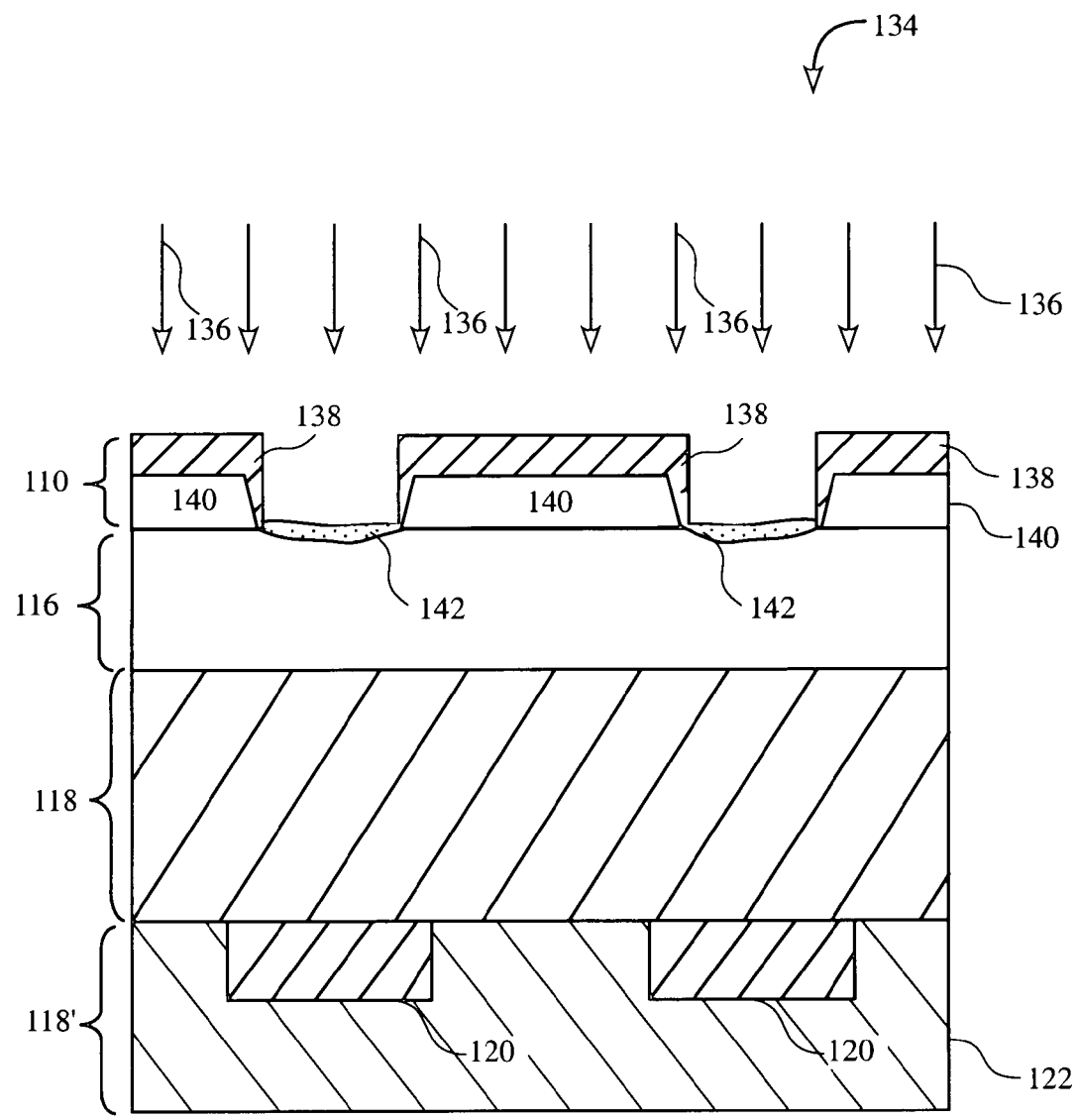
FIG. 3 illustrates a block diagram depicting a developed photoresist being exposed to an ultraviolet (UV) light in accordance with one embodiment of the invention.

FIG. 3 illustrates block diagram 134 depicting a developed photoresist being subjected to UV light in accordance with one embodiment of the invention. Substrate 122 of diagram 134 contains a top layer 110 of developed silicon-containing photoresist. The substrate 122 and the top photoresist layer is exposed to UV light 136. In one embodiment, the UV light 136 is generated by striking a plasma. In a preferred embodiment, the plasma is a mixture of argon gas and neon gas, where the neon gas is the UV generating agent. It should be appreciated that the argon-neon plasma emits UV light 136 which in turn causes the polymer chains of the silicon-containing photoresist to cross link. In accordance with one embodiment of the invention, the substrate layer 110 of silicon-containing photoresist is exposed to the UV light 136 emitted by the plasma. For illustration purposes, the UV light 136 emitted by the plasma is depicted by arrows 136. The flow rate of the argon and neon gases are controlled through the etch chamber controls, as will be described in reference to FIG. 5. In still another embodiment of the invention, the helium gas replaces neon gas as the UV generating agent.

Continuing with FIG. 3, the UV light interacts with the top layer 110 of the silicon-containing photoresist to form a hardened layer 138. It should be appreciated that the exposure to UV light causes the polymer chains of the silicon-containing photoresist to cross-link. In accordance with one embodiment of the invention, silicon-hydrogen (Si—H) and/or silicon-CH$_3$ bonds are formed to cross link the polymer chains of the silicon-containing photoresist The cross linked polymer chains form a hardened layer 138. The etch selectivity of the hardened layer 138, relative to the bottom photoresist layer 116 or the ILD 118, is greater due to the cross-linking of the polymer chains, which in turn creates a more impenetrable barrier for future etch processes. Accordingly, the etch process will yield sharper profiles as well as accommodate high aspect ratio features that coincide with smaller semiconductor devices.

In a preferred embodiment of the invention as illustrated in FIG. 3, the top layer 110 of silicon-containing photoresist has a thickness of about 2000 521 while the bottom layer 116 of non silicon-containing photoresist has a thickness of about 6000 Å. In a general embodiment, the silicon-containing photoresist has a thickness that ranges between 1000 Å and about 3000 Å, while the bottom layer 116 of non silicon-containing photoresist has a thickness that ranges between about 3000 Å and about 8000 Å. In another embodiment of the invention, the cross-linked layer 138 has a thickness between about 5% to about 75% of the thickness of the original layer 110.

As can be seen in diagram 134 of FIG. 3, the remainder of the top layer of the silicon-containing photoresist is unchanged as depicted by unconverted regions 140. In addition, regions 142 of the lower photoresist layer 116 of non silicon-containing photoresist are exposed to the UV light but are not cross-linked because of the lack of silicon in the lower photoresist layer 116. It should be appreciated that the conversion process may take place inside a chamber, such as an etch chamber which has a plurality of gas inlets. In such an embodiment the chamber is configured to control parameters, such as a flow rate of the argon and neon gases, a pressure inside the chamber, a temperature inside the chamber and the power of a top and bottom electrode. The preferred ranges for these parameters are discussed in reference to FIG. 5. Just as significant, the use of an etch chamber allows for combining the different fabrication steps i.e., hardening the photoresist layer 110 and downstream etching, in a single system, thereby increasing wafer throughput.

Figure 4:
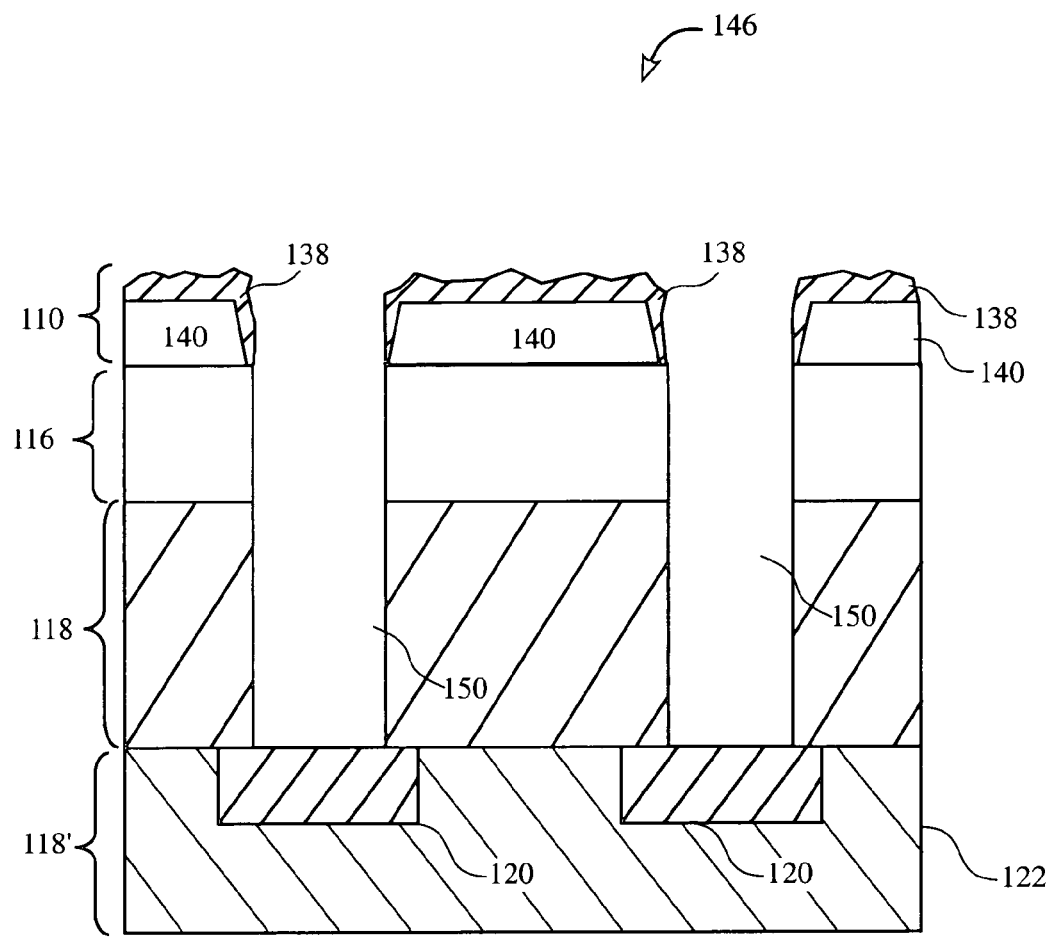
FIG. 4 illustrates a block diagram depicting an etched substrate having a post-etched hardened top layer of silicon-containing photoresist.

FIG. 4 illustrates block diagram 146 depicting an etched substrate having a post-etched hardened top layer 138 of a silicon-containing photoresist. Block diagram 146 displays etch profiles 150 which have been etched into substrate 122. It should be appreciated that either dry etch or wet etch processes can be used to create etch profile for via 150. As depicted by FIG. 4, the hardened layer 138 of the top layer 110 of silicon-containing photoresist shows the effects of the etching process, where the thickness of the hardened layer 138 has been decreased through the etching process. In accordance with one embodiment of the invention, the etching process is part of a dual damascene process where the interlayer dielectric 118 is etched down to copper metallization line 120. It should be appreciated that for a dual damascene process the etch may proceed through multiple dielectrics so that copper interconnect wiring may be formed.

FIG. 4 displays a via 150 etched through the dielectric to the copper metallization line 120. It can be appreciated that as devices further decrease in size, the aspect ratio of the vias, i.e., the ratio of the via depth to its width, increases. The higher aspect ratios require highly accurate etching to ensure device performance. As the aspect ratio increases the etching selectivity of the photoresists needs to increase so as to adequately protect the underlying dielectric. While FIG. 4 demonstrates a portion of the hardened layer 138 remaining on the substrate 122, if the selectivity of the hardened layer 138 was not increased through the invention described herein, then the etching process may etch through photoresist layers 110 and 116 into the dielectric 118. Accordingly, the further miniaturization of device features will continue to increase aspect ratios of the same features. As such, increasing the etching selectivity, as described herein, will ensure underlying layers are adequately protected during the etching process. While FIG. 4 depicts an etch of a via to the copper interconnects, it should be understood that hardened photoresist layer 138 is applicable for any type of dual damascene process including via first, trench first and self aligned processes Still referring to FIG. 4, in accordance with one embodiment of the invention, the etch rate of the hardened layer 138 of the top layer 110 of the silicon-containing photoresist relative to the etch rate of the non silicon-containing photoresist layer 116 decreases. Likewise, the etch rate of the hardened layer 138 relative to the etch rate of the ILD 118 decreases. Accordingly, the selectivity ratio ($S_r$), defined by the etch rate of the film undergoing the etch ($E_f$) divided by the etch rate of the photoresist ($E_r$), increases. The higher selectivity translates to the etching occurring on the desired layers, i.e., the material under the hardened layer 138 is shielded during etching as the etch rate of the hardened layer is smaller than the etch rate of the non silicon-containing photoresist 116 or the ILD 118. In accordance with one embodiment of the invention, the selectivity ratio ($S_r$) of a silicon cross-linked hardened layer 138 and the non silicon-containing photoresist 116 is between about 8 and about 15. As further illustrated in FIG. 4, the hardened layer 138 effectively shields the layers below it. It should be appreciated that in this embodiment, even if the hardened layer is etched away completely during the etching process, the non silicon-containing layer is still available to shield the appropriate areas of the substrate from the etching process.

Figure 5:
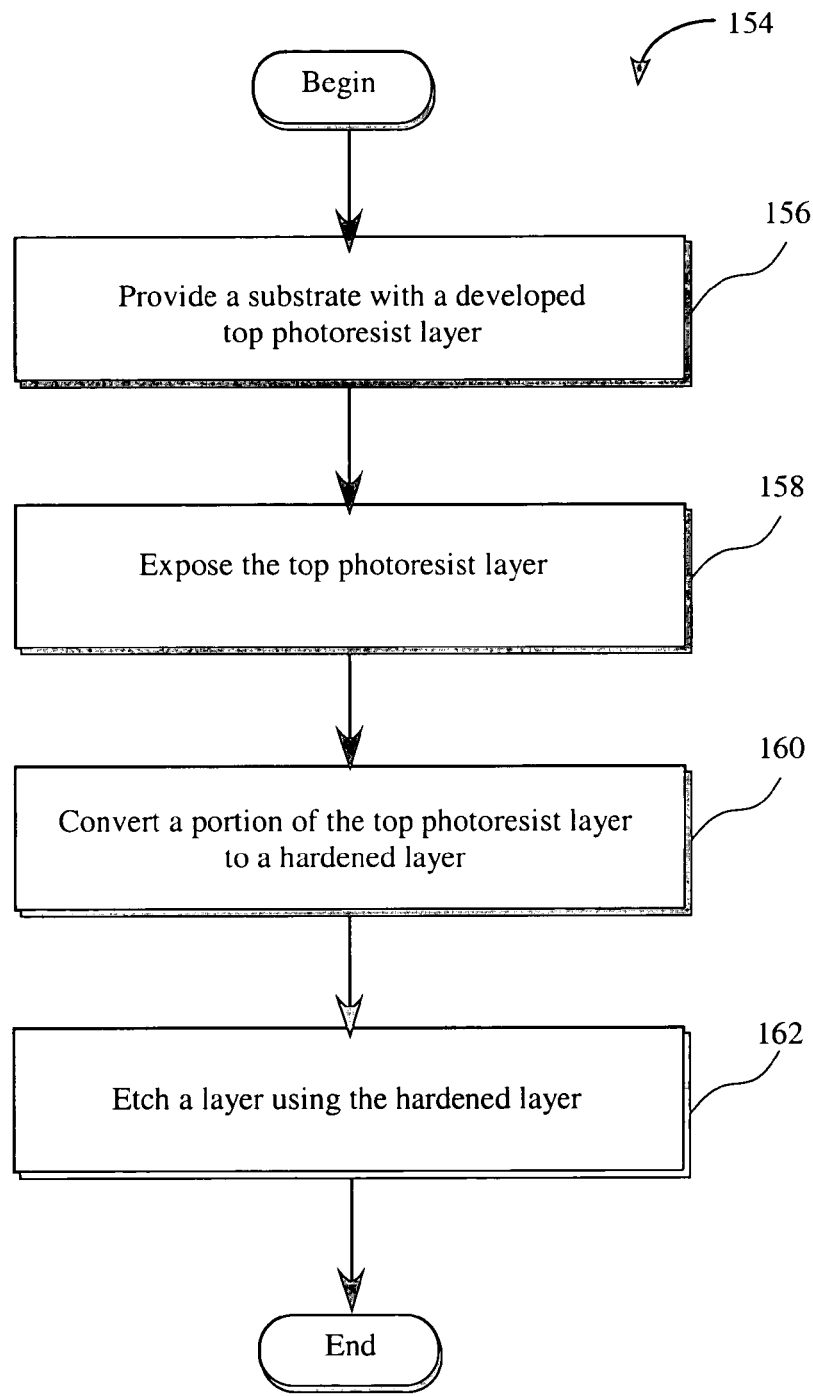
FIG. 5 illustrates a flowchart depicting a method for increasing a silicon-containing photoresist selectivity in accordance with one embodiment of the invention.

FIG. 5 illustrates flowchart 154 depicting a method for increasing a silicon-containing photoresist selectivity in accordance with one embodiment of the invention. Flowchart 154 initializes with operation 156 where a substrate with a developed photoresist is provided. Here, the substrate may include one or more photoresists with the top photoresist being developed as discussed in reference to FIG. 1. In accordance with one embodiment of the invention, the developed photoresist is a silicon-containing photoresist.

Flowchart 154 then proceeds to operation 158 where the top photoresist layer is exposed to UV light generated by a UV light generating agent. Here, the exposure may be inside an etch chamber. Accordingly, the substrate will rest on a support within the chamber such as a chuck. In accordance with one embodiment of the invention, the UV light generating agent is a neon-containing plasma. For example, a neon gas is introduced into the etch chamber through process gas inlets, thereby creating the curing environment to harden a silicon-containing photoresist when the plasma is struck. In a preferred embodiment, neon gas is provided to the etch chamber with an inert gas such as argon. Other UV generating agents that may be used include helium, hydrogen, krypton and xenon. It should be further appreciated that the creation of the hardening layer may be initiated by striking a plasma within the etch chamber and controlling certain parameters inside the etch chamber as discussed below.

As is well known in the art, etch chambers are capable of controlling various parameters. In accordance with one embodiment of the invention, the flow rate of the process gases, the pressure and temperature within the chamber, and the power to the top and bottom electrodes are controlled within the ranges that follow. It should be appreciated that the following ranges are provided for illustration purposes only. The flow rate of an inert gas for a carrier gas, such as argon, is between about 1000 standard cubic centimeters per minute (sccm) to about 3000 sccm with a preferred flow rate of about 2000 sccm. The flow rate for the UV generating agent, such as neon, is between about 0.2% and about 0.8% of the flow rate of the carrier gas such as argon with a preferred flow rate of about 0.4% of the carrier gas flow rate. The pressure within the chamber is controlled between about 1 Torr and about 5 Torr with a preferred pressure of about 3 Torr. The temperature within the chamber is controlled between about −30° Celsius (C.) and about 70° C. with a preferred temperature of about 0° C. The power to the top electrode is between about 100 watts (W) and about 1500 W with a preferred power of about 600 W. The power to the bottom electrode is between about 0 W to about 1000 W with a preferred power of about 0 W. It should be appreciated that the above ranges may vary in different etch chambers.

Returning back to FIG. 5, following operation 158 the method advances to operation 160, where a portion of the first photoresist layer is transformed to a hardened layer. As mentioned previously, the UV light induces the hardening agent of the top photoresist layer to form cross-linked polymer chains with Si—H bonds and Si—CH$_3$ bonds. It should be appreciated that the exposing the silicon-containing photoresist to the UV light induces the polymers of the photoresist to form a cross-linked network of polymers from the previously single uncross-linked polymer chains of the photoresist. In one embodiment of the invention the polymers are cross-linked through Si—H bonds and Si—CH$_3$ bonds. Finally the method terminates with operation 162, where an etch is performed using the hardened layer. Here, a via may be etched as shown in FIG. 4. Alternatively, a trench may be etched and silicon containing photoresist applied and hardened, as described above, to define a region for etching a via.

As described above in reference to FIG. 3, the hardened layer 138 has a thickness of about 50% of the original thickness of the silicon-containing photoresist layer. It should be appreciated that the hardened layer 138 of the substrate will improve the selectivity for future etching of the substrate 122. In other words, the selectivity of the hardened layer relative to the bottom photoresist layer 116 and the ILD 118 is increased, thereby ensuring optimal critical dimension and profile control. In a preferred embodiment of the invention, the selectivity ratio between the hardened layer and the non silicon-containing photoresist or the ILD is between about 8 to about 15.

It should be appreciated that the above described invention may be employed with a single silicon-containing photoresist layer is used without an underlying photoresist layer being applied to the substrate. Also, as mentioned above the invention may be utilized as part of a dual damascene process or traditional metallization processes where aluminum alloy forms the metal lines.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for increasing a selectivity of a photoresist, comprising:
    providing a substrate with a developed silicon-containing photoresist layer disposed over a non-silicon containing photoresist layer, the developed silicon-containing photoresist layer including polymer chains containing silicon;
    exposing the developed silicon-containing photoresist layer and uncovered portions of the non-silicon containing photoresist layer to ultraviolet (UV) light, the UV light emanating from a UV generating agent;
    converting a top portion of the developed silicon-containing photoresist layer to a hardened layer, the hardened layer being created by cross-linking the polymer chains containing silicon, the cross-linking being activated by the UV light; and performing an etch using the hardened layer.

2. The method as recited in claim 1, wherein the polymer chains are cross-linked through one of the silicon-hydrogen bonds and silicon-$CH_3$ bonds.

3. The method as recited in claim 1, wherein the method operation of providing a substrate with a developed silicon-containing photoresist layer disposed over a non-silicon containing photoresist layer further includes, placing the substrate in an etch chamber.

4. The method as recited in claim 3, wherein the exposing the substrate further includes, controlling the flow rate of an inert gas to the chamber between about 1000 sccm and about 3000 sccm.

5. The method as recited in claim 4, wherein the inert gas is argon.

6. The method as recited in claim 5, wherein the UV generating agent is neon.

7. The method as recited in claim 6, wherein the flow rate of the neon is between about 0.02% and about 0.8% of the flow rate of the argon.

8. The method as recited in claim 6, wherein the method operation of exposing the substrate further includes, striking a plasma composed of argon gas and neon gas.

9. The method as recited in claim 1, wherein the top portion of the developed silicon containing photoresist layer converted to the hardened layer is between about 5% and about 75% of the developed silicon containing photoresist layer.

10. In an etch chamber, a method for increasing a selectivity of a top photoresist disposed over a bottom photoresist, comprising:

applying a first non-silicon containing photoresist layer as the bottom photoresist over a substrate; applying a second silicon-containing photoresist layer as the top photoresist over the first photoresist layer;

exposing a portion of the second photoresist layer to ultraviolet light generated through one of a mercury arc lamp and excimer an laser;

removing the exposed portion of the second photoresist layer to define a developed second photoresist layer, resulting in a portion of the first non-silicon containing photoresist layer being exposed;

striking a plasma in the etch chamber;

generating ultraviolet (UV) light from the plasma, thereby exposing the developed second photoresist layer and the exposed first non-silicon containing photoresist layer to plasma generated UV light;

converting a top portion of the developed silicon-containing photoresist layer to a hardened layer, the hardened layer being created by cross-linking of polymer chains containing silicon, the cross-linking being activated by the plasma generated UV light; and performing an etch operation.

11. The method of claim 10, wherein the method operation of generating ultraviolet (UV) light from the plasma, thereby exposing the developed second photoresist layer and the exposed first non-silicon containing photoresist layer to plasma generated UV light includes, controlling a chamber temperature at about 0 degrees Celsius.

12. The method of claim 10, wherein the method operation of striking a plasma in the etch chamber includes, introducing an inert gas and a UV generating gas selected from the group consisting of neon, xenon, helium, hydrogen, and krypton.

* * * * *